United States Patent
Bergeal

Patent Number: 5,559,439
Date of Patent: Sep. 24, 1996

[54] METHOD AND DEVICE FOR MEASURING THE COMPENSATION TUNING AND DETUNING OF AN ELECTRICAL DISTRIBUTION NETWORK

[75] Inventor: Jean Bergeal, Palaiseau, France

[73] Assignee: Electricite De France Service National, Paris, France

[21] Appl. No.: 290,744

[22] PCT Filed: Oct. 8, 1993

[86] PCT No.: PCT/FR93/01000

§ 371 Date: Apr. 19, 1995

§ 102(e) Date: Apr. 19, 1995

[87] PCT Pub. No.: WO94/10735

PCT Pub. Date: May 11, 1994

[30] Foreign Application Priority Data

Oct. 26, 1992 [FR] France ................ 92 12756

[51] Int. Cl.$^6$ ................ G01R 31/00
[52] U.S. Cl. ............ 324/509; 324/650; 324/521; 307/29; 361/113
[58] Field of Search ............... 361/113; 307/29; 324/509, 650, 72, 521

[56] References Cited

U.S. PATENT DOCUMENTS

| | | | |
|---|---|---|---|
| 4,368,498 | 1/1983 | Neuhouser | 324/509 |
| 4,472,676 | 9/1984 | Eichmann | 324/509 |
| 4,857,830 | 8/1989 | Matsuno | 324/509 |

FOREIGN PATENT DOCUMENTS

| | | |
|---|---|---|
| 61704 | 3/1982 | European Pat. Off. . |
| 267500 | 11/1986 | European Pat. Off. . |
| 879716 | 3/1943 | France . |
| 2573256 | 5/1986 | France . |
| 896387 | 11/1953 | Germany . |
| 2735756 | 2/1979 | Germany . |
| WO86/03350 | 6/1986 | WIPO . |

*Primary Examiner*—Kenneth A. Wieder
*Assistant Examiner*—Jose M. Solis
*Attorney, Agent, or Firm*—Sughrue, Mion, Zinn, Macpeak & Seas

[57] ABSTRACT

A method and a device for measuring compensation balance and imbalance in an electrical supply network having a balancing coil. An auxiliary measurement signal is injected into the network's neutral circuit, changes in the homopolar voltage induced by the auxiliary signal injection are measured, and an impedance measurement is obtained by comparing the changes in the hompolar voltage with the injected auxiliary measurement signal, in terms of both amplitude and phase. A parallel current may advantageously be injected into the neutral circuit at the secondary winding of a homopolar transformer placed in the neutral coil.

10 Claims, 2 Drawing Sheets

5,559,439

METHOD AND DEVICE FOR MEASURING THE COMPENSATION TUNING AND DETUNING OF AN ELECTRICAL DISTRIBUTION NETWORK

BACKGROUND OF THE INVENTION

The present invention relates to electrical distribution networks of the compensated type, that is to say that they comprise a compensation coil or Petersen coil which makes it possible to compensate for the capacitive current due to capacitances distributed in the line; the compensation coil makes it possible to obtain balance, that is to say perfect compensation for the capacitive impedances of the line.

The subject of the invention is, more particularly, a method and a device making it possible to measure the detuning of the compensation of the network; in fact, when the intrinsic capacitive impedance of the network varies, as a result, for example, of connecting or disconnecting high-load-factor consumers, the compensation coil is detuned, that is to say that it no longer exactly compensates for the overall capacitance of the network. In such a case it is advantageous to vary the value of the impedance of the compensation coil so as to reestablish balance.

It has already been proposed, in order to detect and measure the imbalance in the compensation of a network, to inject an electric current into the neutral circuit, the frequency of which current is slightly different from the frequency of the network; as a result of the appearance of a beat phenomenon, it is then possible to detect and measure the imbalance of the network. This method is relatively complex and requires a significant amount of equipment, in particular a generator having a different frequency from that of the network. Furthermore, this type of operation requires long adjustment and measurement periods.

It has also been proposed, as described in European Patent 235,145, to provide a device which makes it possible to add a supplementary reactance between the neutral and the earth of the network and subsequently to calculate the attenuation, asymmetry and imbalance parameters of the network. Connecting a supplementary reactance between the neutral and the earth can be done by impedance switching in parallel or in series with the compensation coil or even, in the case when the network comprises a variable compensation coil, by acting on the compensation coil itself.

This method has the drawback that the response time of the measurement thus carried out is high, and may be of the order of several minutes; the accuracy of the measurement is not very good, especially if the asymmetry is low, and this method cannot function reliably under all operational conditions of a network.

SUMMARY OF THE INVENTION

The object of the invention is to provide a method and a device for measuring the imbalance in the compensation of an electrical distribution network compensated by a compensation coil, which have a short response time, which have a low cost price and which function under all circumstances independently of the natural asymmetry of the network.

To this end, the subject of the invention is a method for measuring the compensation imbalance of an electrical distribution network comprising a compensation coil, characterized in that an auxiliary measurement signal is injected into the neutral circuit of the network, in that the variation in the homopolar voltage induced by the said auxiliary signal injection is measured and in that an impedance measurement is carried out by comparison, in amplitude and in phase shift, of the variation in the homopolar voltage with the auxiliary measurement signal.

This is a measurement comprising an active system, the response time of which is significantly less than solutions employing neutral impedance variations. Furthermore, this method can be employed simply.

According to a first embodiment, an auxiliary measurement voltage is injected in series with the compensation coil.

Advantageously, the auxiliary measurement voltage is injected by means of a transformer, the secondary of which is connected in series to the compensation coil.

According to another embodiment, a current is injected in parallel into the neutral circuit.

Advantageously, the auxiliary measurement current is injected into the neutral circuit by means of a homopolar transformer.

This embodiment is particularly advantageous because it requires only very few elements to be installed, in particular when the homopolar transformer already exists on the coil.

Other characteristics and advantages of the invention will emerge from the following description of exemplary embodiments of the invention, made with reference to the attached drawings, in which:

DESCRIPTION OF PREFERRED EMBODIMENTS

Figure 1:
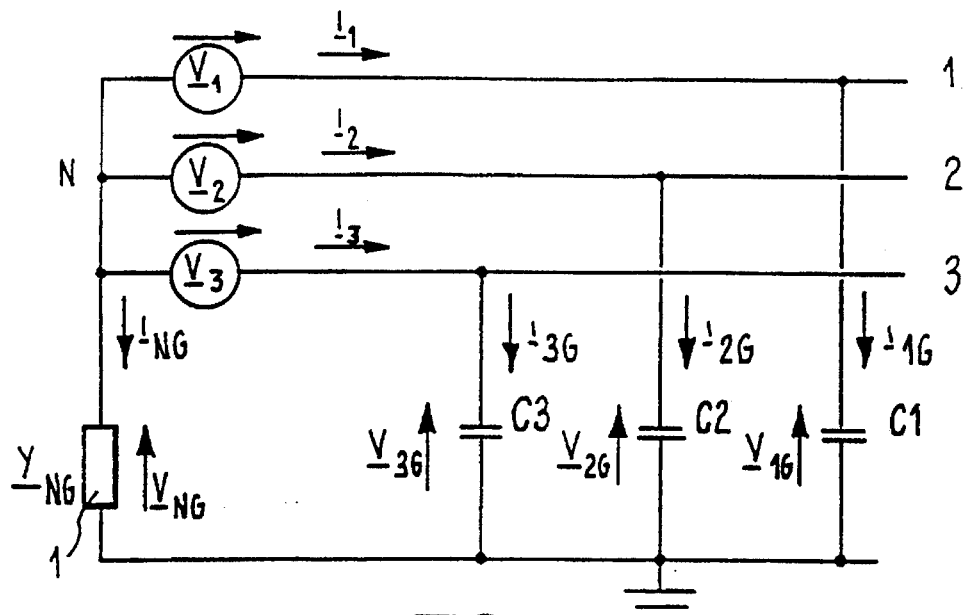
FIG. 1 is the equivalent circuit of a compensated network.

FIG. 1 represents the equivalent circuit of a compensated electrical distribution network. Compensated networks are equipped with a neutral impedance 1, or reactive compensation coil which is connected between the neutral of the voltage source and earth. In the case of a single-phase fault, the reactive current flowing through this compensation coil makes it possible to compensate for the capacitive current in the network so as to limit the fault current.

In FIG. 1, the capacitances distributed in the network are represented by capacitors C1 and C2 and C3.

When the network is in normal service, that is to say that it comprises no faults, the voltage between neutral and earth is determined by three fundamental parameters, the detuning m, the assymetry k and the damping d. The normalized neutral/earth voltage $\underline{v}_{NG}$ is then written:

$$\underline{v}_{NG} = \frac{\underline{V}_{NG}}{V_{nom}} = \frac{k}{m+jd} \qquad (1)$$

$V_{nom}$ being the nominal phase-to-neutral voltage of the network, that is to say the voltage between one phase and neutral, and $\underline{V}_{NG}$ being the voltage across the terminals of the compensation coil 1.

According to the invention, an auxiliary measurement signal is injected into the neutral/earth circuit of the network. The parameters denoted hereinabove are then calculated on the basis of comparison of the injected signal and the variation in the neutral/earth voltage caused by this injection, by applying the superposition theorem.

The new impedance of the neutral/earth circuit is thus measured in amplitude and in phase (by carrying out a vector analysis of $$\frac{\Delta V}{\Delta I}$$

and it is then possible to determine the variation of the coil 1 to be carried out in order to reestablish balance of the network.

Figure 2:
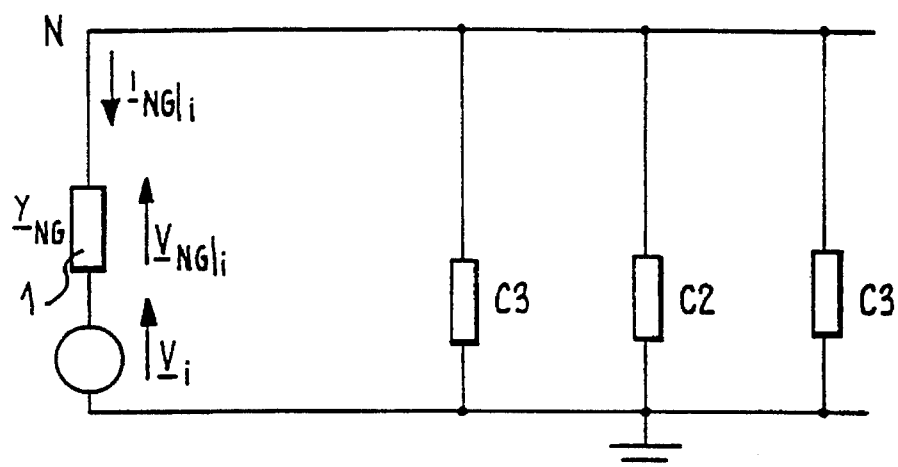
FIG. 2 illustrates the principle of injecting a measurement signal.

This is schematically represented in FIG. 2, which shows the compensation coil 1 and the distributed impedances C1, C2, C3 of each phase.

The method according to the invention consists in injecting a measurement voltage $\underline{V}_i$ in series with the compensation coil 1.

The influence of the voltage injected in series with the coil is expressed by the following equation:

$$\underline{V}_{NG}|_i = \frac{1}{m+jd} \underline{V}_i \qquad (2)$$

The variation in the voltage $\underline{V}_{NG}$ as a function of the injected voltage is measured and it is possible to deduce therefrom the detuning m of the line, which makes it possible to calculate the value by which it is necessary to vary the impedance of the coil i in order to reobtain balance.

Figure 3:
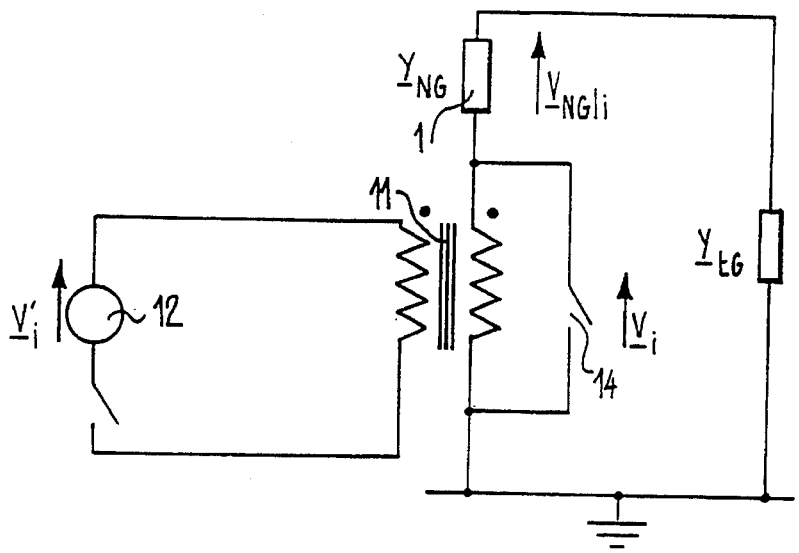
FIG. 3 is a diagram of a device for injecting a voltage in series.

The measurement signal can be injected in two ways. First, a voltage may be injected in series with the coil 1, which makes it necessary to connect an injection transformer 11 in series with the said coil, as represented in FIG. 3. The characteristics of this transformer should be the following:

- the voltage rating should correspond to the maximum possible voltage during a complete single-phase fault for the most unfavourable configuration of the network;
- the current rating should correspond to the maximum possible current flowing through the neutral, also in the case of a complete single-phase fault.

The primary of the transformer 11 is supplied by a voltage source 12.

The transformer 11 may, for example, be a toroidal transformer. The primary circuit should be designed so as to withstand voltage and current stresses in the case of a single-phase fault of the network. A switch 14 makes it possible to short-circuit the injection transformer on the secondary side if the device is not in service.

Figure 4:
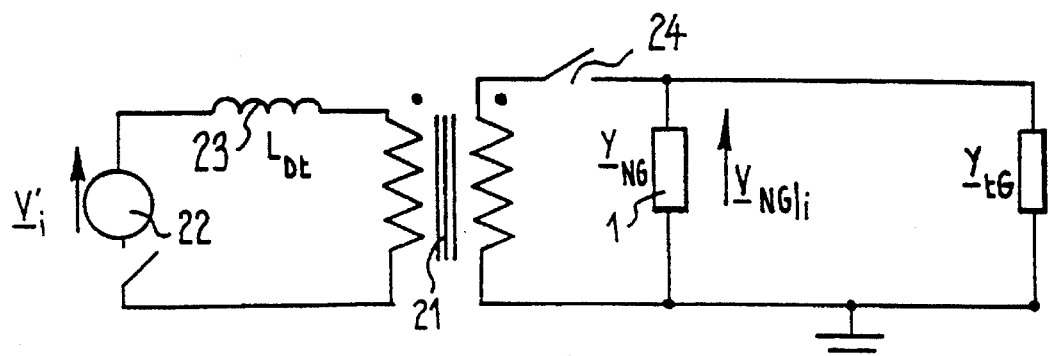
FIG. 4 is the diagram of a device for injecting a current in parallel.

According to a second embodiment, the measurement signal is injected by injecting a parallel current into the neutral coil 1. This is represented in FIG. 4.

Injecting an additional current requires the use of an injection transformer 21 which must satisfy the following conditions:

- the voltage rating should correspond to the maximum possible voltage across the terminals of the coil 1, that is to say the nominal phase to neutral voltage $V_{nom}$ in the case of a complete single-phase faults;
- the current rating should correspond to the maximum current which is to be injected into the network.

The primary of the transformer 21 is supplied by a voltage source 22 in series with an impedance 23. These two elements may be variable and/or switchable; this configuration also makes it possible to vary the total impedance of the neutral/earth connection in order to carry out supplementary measurements without injecting a measurement signal.

This second embodiment of the invention has the advantage that the injection transformer only needs to withstand stresses which are lower than in the case of injecting a voltage in series with the coil 1.

Furthermore, in the case of single-phase fault appearing in the network, in the first embodiment, a large current is induced in the primary of the injection transformer, which again leads to derating this transformer and the auxiliary source.

Another drawback resides in the fact that, in the case of injecting a voltage, the measurement is carried out on a series resonant circuit and not a parallel resonant circuit as in the case of injecting a measurement current. The amplification at resonance is not controlled and may therefore cause the appearance of a large and detrimental homopolar voltage.

Figure 5:
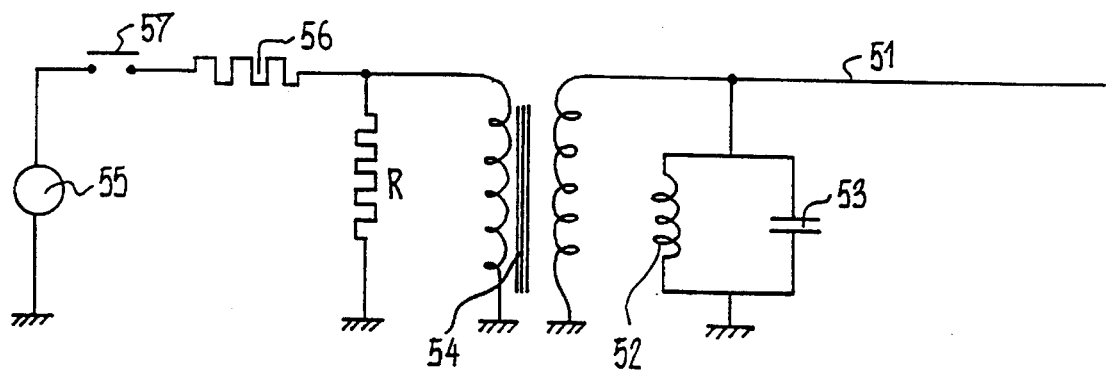
FIG. 5 is the diagram of one embodiment of the invention.

FIG. 5 represents an exemplary embodiment of the invention illustrating the principle of injecting a measurement current.

In this figure, 51 schematically represents a medium-voltage network with 12000 V phase/neutral (20 kV between phases) supplying a low-voltage 400 V network with its compensation coil 52 and its distributed impedance 53. This network comprises, as is frequently the case, a homopolar transformer 54, arranged at the distribution station and using the magnetic core of the neutral point coil. This homopolar transformer 54 is used for injecting the measurement current which is supplied, for example, by an auxiliary voltage source 55 consisting, for example, of the voltage of the auxiliaries of the station, i.e. 220 V, connected in series with a resistor 56 having a resistance of a few tens of ohms, for example 20 ohms.

The resistor R connected on the secondary side of the transformer 54 symbolically represents the damping resistance on the low-voltage side for a 20 A current on the medium-voltage side. If the active component of the medium-voltage current is 20 A, the damping resistance, on the medium-voltage side, is 600 ohms. If the turns of the homopolar transformer 54 are equal to 30, this corresponds to a damping resistance R on the low-voltage side equal to 0.66 ohm.

If the injection resistor 56 has a resistance of 20 ohms and if the voltage source 55 supplies a 220 V voltage, a current of 10.6 A is obtained, which leads to a voltage of approximately 7 V on the low-voltage damping resistance R at tuning; this corresponds to 1.75% in homopolar voltage (value relative to the nominal voltage).

If there is detuning by overcompensation corresponding to a strength of 100 A for example, the variation induced in the homopolar voltage will be divided by 5, that is to say that it will correspond to 0.35%, i.e. a value which is still easy to measure. On the low-voltage side (nominal voltage on complete fault: 400 V), this is then manifested by measuring a voltage variation of 1.4 V on a homopolar voltage which is, at most, of the order of 24 V, i.e. 6% of the maximum fault-free homopolar voltage, in the normal operating regime.

If, on the other hand, there is detuning by undercompensation, there is the possibility of series tuning between the leakage reactance of the homopolar transformer 54 and the residual capacitance of the detuning on the medium-voltage side. This is not a problem because the current is injected using a source on the low-voltage side; this should, if need be, be taken into account when calculating the retuning of the network by measuring the actual homopolar voltage measured at the medium voltage.

In the case of a fault on the medium-voltage side, the voltage obtained is 400 V, possibly in opposition with the auxiliary 220 V source. The result of this is that the current flowing through the injection circuit will be 30 A. The switch 57 for turning on the measurement circuit should consequently be designed for a 30 A current and a 620 V voltage.

The variation in the homopolar voltage may, in the case of FIG. 5, be measured on the low-voltage side or on the medium-voltage side.

It is seen that the invention makes it possible to obtain rapidly, that is to say with a response time which is less than one second, a measurement of the detuning of the network so as, if required, to allow automatic tuning by acting on the compensation coil.

Furthermore, the invention requires no measurement of the asymmetry, as is the case in the device described in the abovementioned European Patent, which thus makes the measurement very easy.

Moreover, the method according to the invention eliminates, in comparison with the currently known device, the requirement of carrying out switching at the compensation coil. This is particularly important because, depending on the type of compensation coil used, a complete absence of compensation may occur during switching. This is particularly unfavourable because a plurality of faults very often occur during a short time lapse, for example in the event of lightning strikes or storms.

Moreover, the fact that switching is not carried out on the compensation coil makes it possible to reduce the price of the latter quite considerably.

The measurement device according to the invention is normally disconnected and it is turned on by operating the switch 57 only when a variation in the homopolar voltage has been detected. A measurement is then carried out by injection of current and, if an imbalance of the network is deduced, the compensation to be made is calculated and is performed, for example, by action on the coil 1.

Another advantage of the invention with respect to the device known from the aforementioned European Patent, in which the earthing impedance is varied, is that, in the known device, the resistance of the neutral/earth circuit must remain constant. In the device according to the invention, the earthing impedance is not altered and the measurement is therefore not vitiated.

This is particularly true if, when switching the taps of the coil or any other variation, its quality factor varies.

The influence on the accuracy of the tuning measurement makes it possible to reduce the cost of the coils by up to a factor of 5.

Another advantage of the invention is that when the measurement signal is injected, this produces a variation in the homopolar voltage which is available throughout the distribution line and therefore constitutes a kind of "carrier current" signal which can be used by any station located on the line in order to carry out remote controlling therein.

The device according to the invention is very economical; in the exemplary embodiment, it is merely necessary to connect, to an auxiliaries voltage which is available in a distribution station, a switch and a resistor which may be as easy as to obtain as those used in electrical heating radiators.

What is claimed is:

1. Method for measuring the tuning and the detuning of the compensation of an electrical distribution network comprising a compensation coil (1), characterized in that an auxiliary measurement signal is injected into the neutral circuit of the network, in that the variation in the homopolar voltage induced by the said auxiliary signal injection is measured and in that an impedance measurement is carried out by comparison, in amplitude and in phase shift, of the variation in the homopolar voltage with the auxiliary measurement signal.

2. Method according to claim 1, characterized in that an auxiliary measurement voltage is injected in series with the compensation coil (1).

3. Method according to claim 1, characterized in that a current is injected in parallel into the neutral circuit.

4. Method according to claim 3, characterized in that the auxiliary measurement current is injected into the neutral circuit by means of a homopolar transformer (54).

5. Method according to claim 3, characterized in that the auxiliary measurement current (21) is injected by means of a measurement transformer, the secondary of which is connected to the compensation coil (1).

6. Method according to claim 2, characterized in that the auxiliary measurement voltage is injected by means of a transformer (11), the secondary of which is connected in series with the compensation coil (1).

7. A device for measuring tuning and detuning of compensation of an electrical distribution network having a neutral circuit and a compensation coil, said device comprising:

means for injecting an auxiliary measurement signal into the neutral circuit of the network;

means for measuring a variation of a homopolar voltage induced by the injected auxiliary signal; and impedance measurement means for comparing, in amplitude and in phase shift, the variation in the homopolar voltage with the auxiliary measurement signal.

8. The device according to claim 7, further comprising a current source (55, 56) connected in series in a primary circuit of a homopolar transformer (54).

9. The device according to claim 8, characterized in that said current source is obtained from the auxiliary voltage of a control station of the network.

10. Device according to claim 9, characterized in that the homopolar transformer has a secondary winding delivering a low voltage-level voltage in the event of complete fault of the network and in that the current source consists of a resistor having a resistance of a few tens of ohms supplied by the auxiliary voltage of the station.

* * * * *